United States Patent
Yumoto et al.

(10) Patent No.: US 11,435,388 B2
(45) Date of Patent: Sep. 6, 2022

(54) ELECTRIC VEHICLE AND CONTROL METHOD FOR ELECTRIC VEHICLE

(71) Applicant: Toyota Jidosha Kabushiki Kaisha, Toyota Aichi-ken (JP)

(72) Inventors: Shingo Yumoto, Toyota (JP); Koichi Kojima, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/666,933

(22) Filed: Oct. 29, 2019

(65) Prior Publication Data

US 2020/0134944 A1 Apr. 30, 2020

(30) Foreign Application Priority Data

Oct. 31, 2018 (JP) .............................. JP2018-204872

(51) Int. Cl.
*G01R 31/00* (2006.01)
*G07C 5/08* (2006.01)
*B60L 53/16* (2019.01)

(52) U.S. Cl.
CPC ............ *G01R 31/005* (2013.01); *B60L 53/16* (2019.02); *G01R 31/007* (2013.01); *G07C 5/0808* (2013.01); *B60Y 2200/91* (2013.01); *B60Y 2300/91* (2013.01)

(58) Field of Classification Search
CPC .................................................. G01R 31/005
USPC ....................................................... 701/34.4
See application file for complete search history.

(56) References Cited

U.S. PATENT DOCUMENTS

| | | | |
|---|---|---|---|
| 6,828,798 B2* | 12/2004 | Morimoto | B60L 58/26 903/907 |
| 10,948,524 B2* | 3/2021 | Kim | G01R 19/22 |
| 2002/0070608 A1* | 6/2002 | Matsuki | B23K 31/02 324/420 |
| 2013/0249282 A1* | 9/2013 | Ishii | B60L 53/14 307/10.1 |
| 2014/0016238 A1* | 1/2014 | Tazaki | B60L 53/14 361/88 |
| 2014/0354054 A1* | 12/2014 | Katou | B60L 58/18 307/43 |
| 2015/0060423 A1* | 3/2015 | Tanaka | B23K 9/0671 219/130.01 |

(Continued)

FOREIGN PATENT DOCUMENTS

| | | |
|---|---|---|
| JP | 2005-090303 A | 4/2005 |
| JP | 2011-015567 A | 1/2011 |

(Continued)

*Primary Examiner* — Jerry D Robbins
(74) *Attorney, Agent, or Firm* — Dinsmore & Shohl LLP

(57) ABSTRACT

An electronic control unit of an electric vehicle is configured to, in a case of making a welding diagnosis of a charging relay with an external power supply device not being connected to a charging inlet, start the welding diagnosis when a vehicle speed becomes equal to or higher than a first vehicle speed, interrupt the welding diagnosis when the vehicle speed becomes equal to or lower than a second vehicle speed during the welding diagnosis, and resume the welding diagnosis when the vehicle speed becomes equal to or higher than the first vehicle speed during the interruption of the welding diagnosis. The second vehicle speed is equal to or lower than the first vehicle speed.

6 Claims, 3 Drawing Sheets

(56) References Cited

U.S. PATENT DOCUMENTS

| | | | | |
|---|---|---|---|---|
| 2015/0241500 A1* | 8/2015 | Mochizuki | ................ | B60L 3/04 |
| | | | | 324/418 |
| 2016/0075251 A1* | 3/2016 | Choi | ........................ | B60L 53/16 |
| | | | | 320/109 |
| 2018/0294660 A1* | 10/2018 | Byun | ................... | H02J 7/00304 |
| 2019/0184849 A1* | 6/2019 | Lim | ........................ | B60L 53/18 |

FOREIGN PATENT DOCUMENTS

| | | |
|---|---|---|
| JP | 2013-188068 A | 9/2013 |
| JP | 2016-101032 A | 5/2016 |
| JP | 2016-119762 A | 6/2016 |
| WO | 2016/016995 A1 | 2/2016 |

\* cited by examiner ously made in the second failure detection. With this configuration, failure detection of the charging relays is performed while the vehicle is traveling during which the user is not able to touch the electrode parts of the charging inlet. Failure detection of the charging relays can thus be quickly performed while ensuring safety.

SUMMARY

The above electric vehicle performs failure detection of the charging relays while the vehicle is traveling during which the user is not able to touch the electrode parts of the charging inlet. However, this configuration does not consider the case where the vehicle is decelerated and stopped by the time the detection result is confirmed after the failure detection of the charging relays is started.

The disclosure provides an electric vehicle and a control method for an electric vehicle in which, in the case where a welding diagnosis of a charging relay is made with an external power supply device not being connected to a charging inlet, the welding diagnosis can be quickly made while ensuring high safety.

A first aspect of the present disclosure provides an electric vehicle that includes: an electrical storage device; a charging inlet that is connected to an external power supply device; a charging relay including a positive-side relay and a negative-side relay; and an electronic control unit configured to make a welding diagnosis for determining whether welding of the charging relay has occurred. The positive-side relay is provided on a positive side of a charging line that connects the charging inlet and the electrical storage device, and the negative-side relay is provided on a negative side of the charging line. The electronic control unit is configured to, in a case of making the welding diagnosis of the charging relay with the external power supply device not being connected to the charging inlet, start the welding diagnosis when a vehicle speed becomes equal to or higher than a first vehicle speed, interrupt the welding diagnosis when the vehicle speed becomes equal to or lower than a second vehicle speed during the welding diagnosis, and resume the welding diagnosis when the vehicle speed becomes equal to or higher than the first vehicle speed during the interruption of the welding diagnosis. The second vehicle speed is equal to or lower than the first vehicle speed.

In the above aspect, in the case where the electronic control unit makes the welding diagnosis of the charging relay with the external power supply device not being connected to the charging inlet, it starts the welding diagnosis when the vehicle speed becomes equal to or higher than the first vehicle speed, interrupts the welding diagnosis when the vehicle speed becomes equal to or lower than the second vehicle speed during the welding diagnosis, and resumes the welding diagnosis when the vehicle speed becomes equal to or higher than the first vehicle speed during the interruption of the welding diagnosis, and the second vehicle speed is equal to or lower than the first vehicle speed. This ensures high safety even in the case where the vehicle is decelerated and stopped by the time the diagnosis result is confirmed after the welding diagnosis of the charging relay is started. Since the welding diagnosis is interrupted when the vehicle speed becomes equal to or lower than the second vehicle speed during the welding diagnosis, the first vehicle speed can be set to a low value and the welding diagnosis can be quickly made. This further enhances safety in the case where the welding diagnosis of the charging relay is made with the external power supply device not being connected to the charging inlet, and also allows the welding diagnosis to be made more quickly.

In the above aspect, the second vehicle speed may be lower than the first vehicle speed. This restrains the welding diagnosis from being frequently and repeatedly interrupted and resumed.

In the above aspect, the electronic control unit may be configured to make a single-electrode welding diagnosis as the welding diagnosis that is made with the external power supply device not being connected to the charging inlet. The single-electrode welding diagnosis is a diagnosis for determining whether welding of only one of the positive-side relay and the negative-side relay has occurred. The electronic control unit may be configured to, in the case where the single-electrode welding diagnosis is interrupted with the welding diagnosis of one of the positive-side relay and the negative-side relay being completed and the welding diagnosis of the other relay not being completed, make only the welding diagnosis of the other relay when resuming the single-electrode welding diagnosis. With this configuration, unnecessary diagnoses can be reduced even in the case where the single-electrode welding diagnosis is interrupted. The single-electrode welding diagnosis can thus be quickly made.

In the above aspect, the electronic control unit may be configured to sequentially make a two-electrode welding diagnosis and a single-electrode welding diagnosis with the external power supply device being connected to the charging inlet. The two-electrode welding diagnosis is a diagnosis for determining whether welding of both the positive-side relay and the negative-side relay has occurred, and the single-electrode welding diagnosis is a diagnosis for determining whether welding of only one of the positive-side relay and the negative-side relay has occurred. The electronic control unit may be configured to make the single-electrode welding diagnosis with the external power supply device not being connected to the charging inlet, when a result of the two-electrode welding diagnosis is normal but the external power supply device is detached from the charging inlet before the single-electrode welding diagnosis is completed. With this configuration, the single-electrode welding diagnosis can be normally safely made with the external power supply device being connected. Moreover, even if the single-electrode welding diagnosis has not been completed as usual, the single-electrode welding diagnosis can be made while ensuring safety.

The electric vehicle of the above aspect may further include: a motor that outputs power for driving the electric vehicle; and a main relay provided on a power line that supplies electric power from the electrical storage device to the motor. The charging line may be connected to the power line at a position between the main relay and the motor. The electronic control unit may be configured to, in the case where a result of the welding diagnosis made while the electric vehicle is traveling with the main relay on is abnormal, turn off the main relay when the electric vehicle is stopped and prohibit further traveling of the electric vehicle. This configuration ensures higher safety.

A second aspect of the disclosure is a control method for an electric vehicle. The electric vehicle includes an electrical storage device, a charging inlet that is connected to an external power supply device, a charging relay, and an electronic control unit. The charging relay includes a positive-side relay and a negative-side relay. The positive-side relay is provided on a positive side of a charging line that connects the charging inlet and the electrical storage device. The negative-side relay is provided on a negative side of the charging line. The method includes: making, by the electronic control unit, a welding diagnosis for determining whether welding of the charging relay has occurred; and in the case where the electronic control unit makes the welding diagnosis of the charging relay with the external power supply device not being connected to the charging inlet, starting the welding diagnosis by the electronic control unit when a vehicle speed becomes equal to or higher than a first vehicle speed, interrupting the welding diagnosis by the electronic control unit when the vehicle speed becomes equal to or lower than a second vehicle speed during the welding diagnosis, and resuming the welding diagnosis by the electronic control unit when the vehicle speed becomes equal to or higher than the first vehicle speed during the interruption of the welding diagnosis. The second vehicle speed is equal to or lower than the first vehicle speed.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A mode for carrying out the disclosure will be described.

Figure 1:
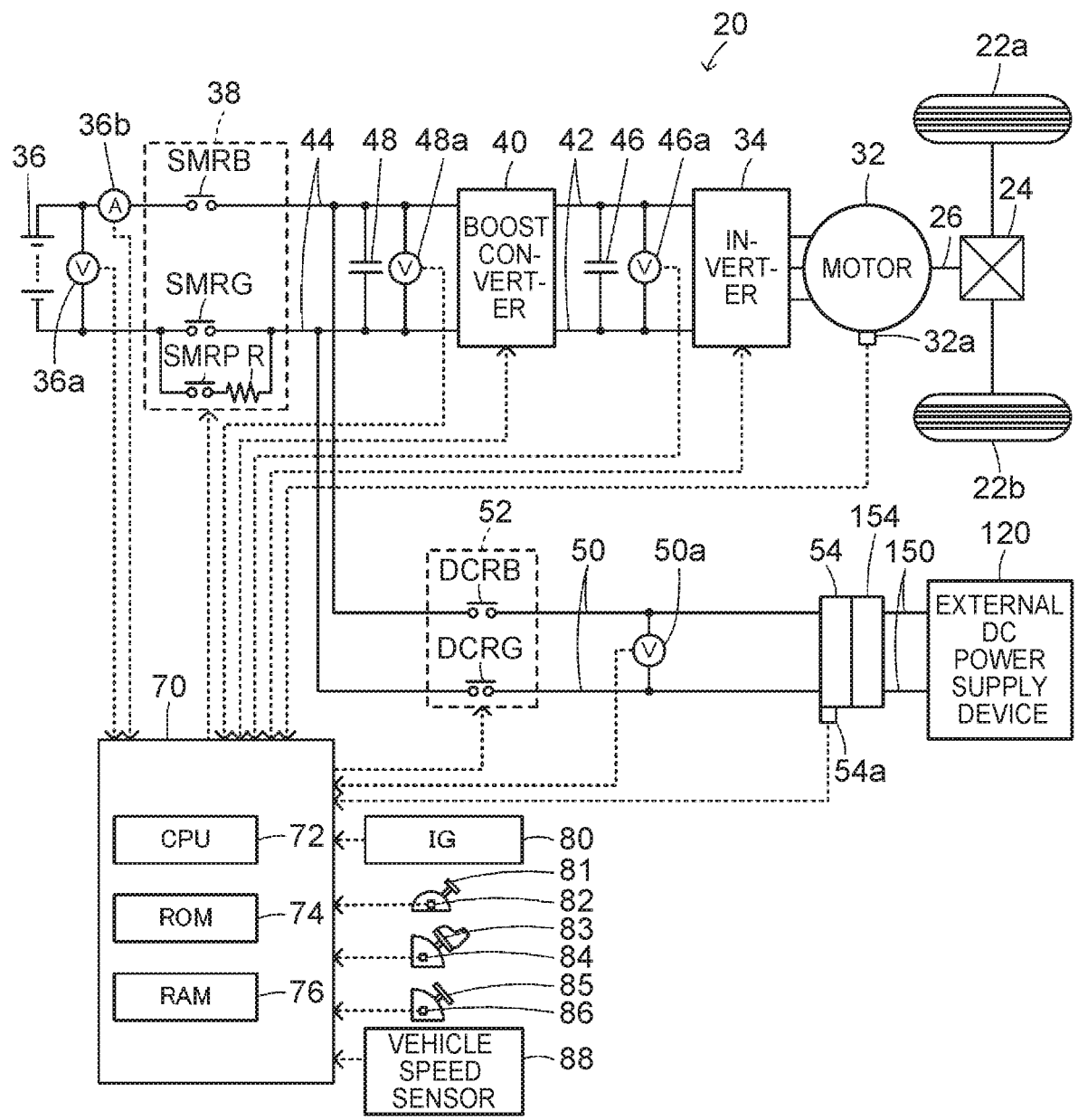
FIG. 1 is a configuration diagram schematically showing the configuration of an electric car according to an embodiment of the disclosure.

FIG. 1 is a configuration diagram schematically showing the configuration of an electric car 20 according to an embodiment of the disclosure. As shown in the figure, an electric car 20 of the embodiment includes a motor 32, an inverter 34, a battery 36, a boost converter 40, a high voltage-side power line 42, a low voltage-side power line 44, a system main relay 38, a charging power line 50, a charging relay 52, and an electronic control unit 70.

The motor 32 is configured as a synchronous motor-generator and includes a rotor with permanent magnets embedded therein and a stator with a three-phase coil wound therein. The rotor of the motor 32 is connected to a driveshaft 26 coupled to drive wheels 22a, 22b via a differential gear 24.

The inverter 34 is connected to the motor 32 and is also connected to the high voltage-side power line 42. The inverter 34 is configured as a well-known inverter circuit having six transistors and six diodes.

The battery 36 is configured as, e.g., a lithium-ion secondary battery or a nickel-metal hydride secondary battery and is connected to the low voltage-side power line 44.

The boost converter 40 is connected to the high voltage-side power line 42 and the low voltage-side power line 44. The boost converter 40 is configured as a well-known buck-boost converter circuit having two transistors, two diodes, and a reactor.

A high voltage-side capacitor 46 is connected to a positive line and a negative line of the high voltage-side power line 42. A low voltage-side capacitor 48 is connected to a positive line and a negative line of the low voltage-side power line 44. The system main relay 38 is attached to the low voltage-side power line 44. The system main relay 38 has a positive-side relay SMRB, a negative-side relay SMRG, and a precharge circuit. The positive-side relay SMRB is provided on the positive line of the low voltage-side power line 44. The negative-side relay SMRG is provided on the negative line of the low voltage-side power line 44. In the precharge circuit, a precharge resistor R and a precharge relay SMRP are connected in series so as to bypass the negative-side relay SMRG.

The charging power line 50 has its one end connected to the low voltage-side power line 44 at a position between the system main relay 38 and the boost converter 40 (motor 32), and has the other end connected to a vehicle-side inlet 54. The charging relay 52 is attached to the charging power line 50. The charging relay 52 has a positive-side relay DCRB and a negative-side DCRG. The positive-side relay DCRB is provided on a positive-side line of the charging power line 50, and the negative-side DCRG is provided on a negative-side line of the charging power line 50. The charging power line 50 is connected to an external charging power line 150 firm an external DC power supply device 120 by connecting an external connector 154 of the external DC power supply device 120 to the vehicle-side inlet 54. The vehicle-side inlet 54 is provided with a connection switch 54a for detecting whether the external connector 154 is connected to the vehicle-side inlet 54. Although not shown in the figure, the external DC power supply device 120 is a quick charging facility capable of quickly charging the battery 36 with a large current. The external DC power supply device 120 converts electric power from a commercial power supply to DC power to supply the DC power through the external charging power line 150. In order to monitor the charging status, a voltage sensor 50a is attached to the charging power line 50 at a position between the charging relay 52 and the vehicle-side inlet 54.

The electronic control unit 70 is configured as a microprocessor having a CPU 72 as a main component. In addition to the CPU 72, the electronic control unit 70 includes a ROM 74 that stores processing programs, a RAM 76 that temporarily stores data, a flash memory, not shown, input and output ports, not shown, a communication port, not shown, etc.

The electronic control unit 70 receives signals from various sensors through the input port. Examples of the signals that are input to the electronic control unit 70 include a rotational position θm from a rotational position detection sensor (e.g., a resolver) 32a that detects the rotational position of the rotor of the motor 32, a voltage VB from a voltage sensor 36a attached between terminals of the battery 36, and a current LB from a current sensor 36b attached to the output terminal of the battery 36. Further examples of the signals that are input to the electronic control unit 70 include a voltage VH of the high voltage-side capacitor 46 (the high voltage-side power line 42) from a voltage sensor 46a attached between terminals of the high voltage-side capacitor 46 and a voltage VL of the low voltage-side capacitor 48 (the low voltage-side power line 44) from a voltage sensor 48a attached between terminals of the low voltage-side capacitor 48. A connection signal from the connection switch 54a of the vehicle-side inlet 54 and a voltage Vdc from the voltage sensor 50a attached to the charging power line 50 are also input to the electronic control unit 70. Since the electronic control unit 70 also serves as a drive control device for the vehicle, information required for driving control of the vehicle is also input to the electronic control unit 70. Examples of such information include an ignition signal IG from an ignition switch 80, a shift position SP from a shift position sensor 82 for detecting the operation position of a shift lever 81, an accelerator operation amount Acc from an accelerator pedal position sensor 84 for detecting the amount of depression of an accelerator pedal 83, a brake pedal position BP from a brake pedal position sensor 86 for detecting the amount of depression of a brake pedal 85, a vehicle speed V from a vehicle speed sensor 88, etc. When the ignition switch 80 is turned on, the electronic control unit 70 turns on the system main relay 38 to control the motor 32 so that the electric car 20 is driven with a driving force according to the accelerator operation amount Acc while charging and discharging the battery 36.

The electronic control unit 70 outputs various control signals through the output port. Examples of the control signals that are output from the electronic control unit 70 include switching control signals for the transistors of the inverter 34, switching control signals for the transistors of the boost converter 40, a drive control signal for the system main relay 38, a drive control signal for the charging relay 52, etc.

The electronic control unit 70 communicates with the external DC power supply device 120 as a communication line connected to the communication port is connected to an external communication line via the vehicle-side inlet 54 and the external connector 154.

When charging of the battery 36 is finished as the battery 36 is fully charged or predetermined charging time has passed during charging of the battery 36 with electric power from the external DC power supply device 120, the electronic control unit 70 makes a welding diagnosis to determine whether welding of the charging relay 52 (the positive-side relay DCRB, the negative-side relay DCRG) has occurred due to a high voltage. If welding of the charging relay 52 has occurred, there is a risk that a high voltage from the battery 36 may be applied to the electrode parts of the vehicle-side inlet 54. Accordingly, the welding diagnosis is basically made with the external connector 154 being connected to the vehicle-side inlet 54 in order to make sure that the user does not touch the vehicle-side inlet 54. The welding diagnosis includes a two-electrode welding diagnosis and a single-electrode welding diagnosis. The two-electrode welding diagnosis determines whether welding of both the positive-side relay DCRB and the negative-side relay DCRG (two-electrode welding) has occurred. The single-electrode welding diagnosis determines whether welding of only one of the positive-side relay DCRB and the negative-side relay DCRG (single-electrode welding) has occurred.

For example, in the two-electrode welding diagnosis, the CPU 72 of the electronic control unit 70 first turns off the positive-side relay SMRB and the negative-side relay SMRG of the system main relay 38 and turns off the positive-side relay DCRB and the negative-side relay DCRG of the charging relay 52. The CPU 72 then determines whether the voltage Vdc detected by the voltage sensor 50a is less than a predetermined voltage Vref (e.g., a voltage slightly higher than the value 0). When it is determined that the voltage Vdc is equal to or higher than the predetermined voltage Vref, the CPU 72 determines that the voltage from the external DC power supply device 120 is being applied to the charging power line 50 (the battery 36 is being charged) and that a two-electrode welding diagnosis cannot be made. When it is determined that the voltage Vdc is less than the predetermined voltage Vref, the CPU 72 then turns on the positive-side relay SMRB and the negative-side relay SMRG of the system main relay 38 while keeping the positive-side relay DCRB and the negative-side relay DCRG of the charging relay 52 off. The CPU 72 then determines whether the voltage Vdc detected by the voltage sensor 50a is less than the predetermined voltage Vref. When it is determined that the voltage Vdc is less than the predetermined voltage Vref, the CPU 72 determines that two-electrode welding has not occurred in the charging relay 52 (there is no two-electrode welding). When it is determined that the voltage Vdc is equal to or higher than the predetermined voltage Vref, the CPU 72 determines that two-electrode welding has occurred in the charging relay 52 (there is two-electrode welding). The CPU 72 confirms its determination that there is no two-electrode welding when the voltage Vdc continues to be less than the predetermined voltage Vref for a predetermined determination time. The CPU 72 confirms its determination that there is two-electrode welding when the voltage Vdc continues to be equal to or higher than the predetermined voltage Vref for a predetermined determination time.

The single-electrode welding diagnosis is made after it is determined in the two-electrode welding diagnosis that there is no two-electrode welding. In the single-electrode welding diagnosis, the CPU 72 of the electronic control unit 70 turns off the positive-side relay DCRB of the charging relay 52 and turns on the negative-side relay DCRG thereof while keeping the positive-side relay SMRB and the negative-side relay SMRG of the system main relay 38 on. The CPU 72 then determines whether the voltage Vdc is less than the predetermined voltage Vref. When it is determined that the voltage Vdc is equal to or higher than the predetermined voltage Vref, the CPU 72 determines that welding of the positive-side relay DCRB has occurred (there is single-electrode welding). When it is determined that the voltage Vdc is less than the predetermined voltage Vref, the CPU 72 then turns on the positive-side relay DCRB of the charging relay 52 and turns off the negative-side relay DCRG thereof. The CPU 72 then determines whether the voltage Vdc is less than the predetermined voltage Vref. When it is determined that the voltage Vdc is less than the predetermined voltage Vref, the CPU 72 determines that neither welding of the positive-side relay DCRB nor welding of the negative-side relay DCRG has occurred (there is no single-electrode welding). When it is determined that the voltage Vdc is equal to or higher than the predetermined voltage Vref, the CPU 72 determines that welding of the negative-side relay DCRG has occurred (there is single-electrode welding). The CPU 72 confirms its determination that there is no single-electrode welding when the voltage Vdc continues to be less than the predetermined voltage Vref for a predetermined determination time. The CPU 72 confirms its determination that there is single-electrode welding when the voltage Vdc continues to be equal to or higher than the predetermined voltage Vref for a predetermined determination time. When it is determined that welding of the charging relay 52 has occurred, the CPU 72 turns off the system main relay 38 to prohibit further traveling of the electric car 20.

Figure 2:
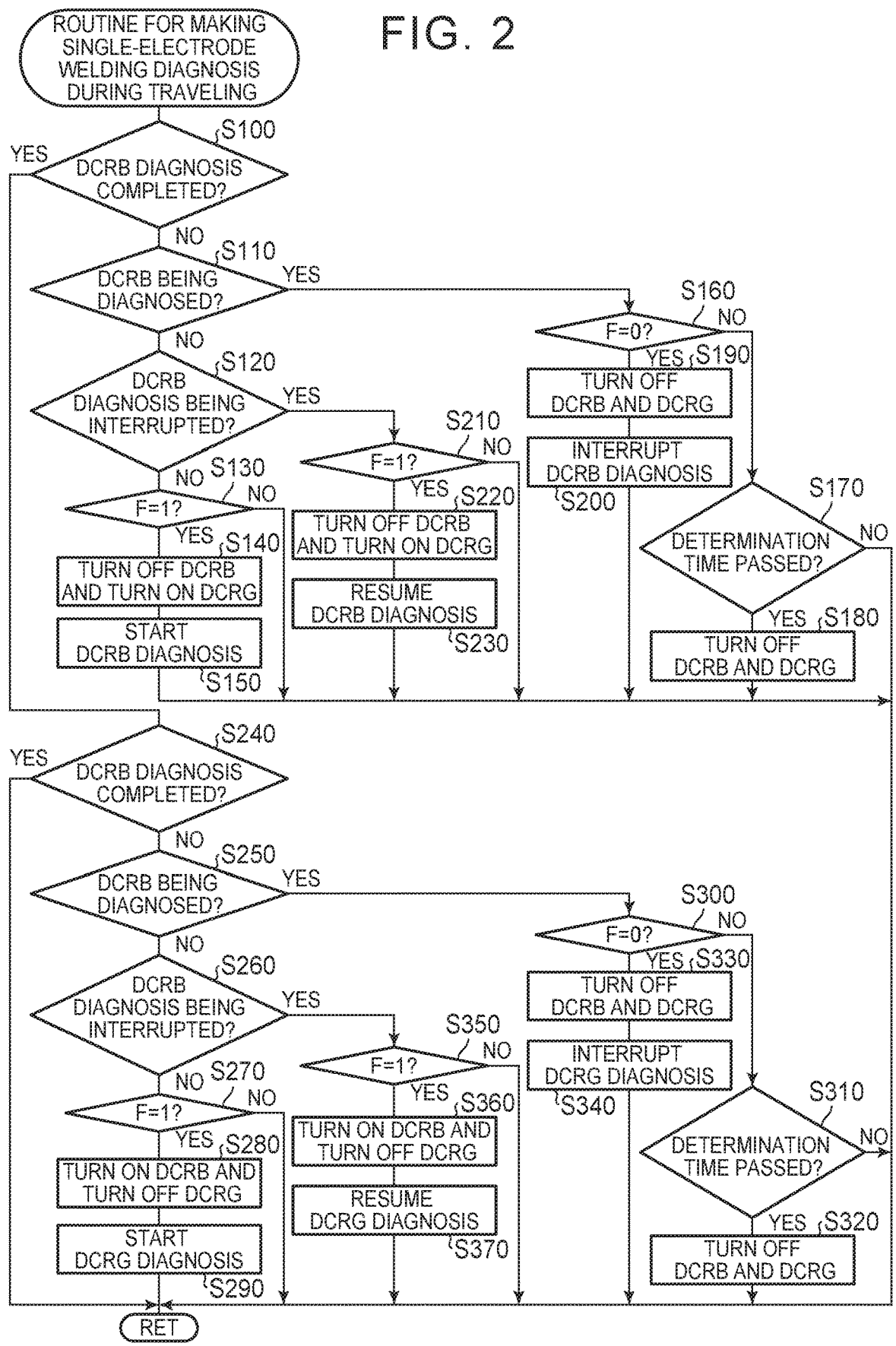
FIG. 2 is a flowchart illustrating an example of a routine for making a single-electrode welding diagnosis during traveling of the vehicle which is executed by a CPU of an electronic control unit.

Operation will be described which is performed to make a single-electrode welding diagnosis again with the external connector 154 not being connected to the vehicle-side inlet 54 when a two-electrode welding diagnosis has been completed but the external connector 154 is detached from the vehicle-side inlet 54 before a single-electrode welding diagnosis is completed. In the case where one of the relays of the charging relay 52 is normal and the other relay is abnormal, it is determined in a two-electrode welding diagnosis that both relays of the charging relay 52 are normal. However, if a single-electrode welding diagnosis is performed in this state, there is a risk that a high voltage from the battery 36 may be applied to the vehicle-side inlet 54. Accordingly, in the present embodiment, in the case where a single-electrode welding diagnosis is made again with the external connector 154 not being connected to the vehicle-side inlet 54, this single-electrode welding diagnosis is made during traveling of the vehicle in order to make sure that the user does not touch the vehicle-side inlet 54 during diagnosis. FIG. 2 is a flowchart illustrating an example of a routine for making a single-electrode welding diagnosis during traveling of the vehicle which is executed by the CPU 72 of the electronic control unit 70. This routine is repeatedly executed at predetermined time intervals (e.g., every several milliseconds) when the external connector 154 is not connected to the vehicle-side inlet 54 (a connection signal from the connection switch 54a is off) and a single-electrode welding diagnosis has not been completed.

In the routine for making a single-electrode welding diagnosis during traveling of the vehicle, the CPU 72 of the electronic control unit 70 first determines whether a single-electrode welding diagnosis of the positive-side relay DCRB of the charging relay 52 has been completed (step S100), is being made (step S110), and has been interrupted (S120). When it is determined that the single-electrode welding diagnosis of the positive-side relay DCRB of the charging relay 52 has not been completed, is not being performed, and has not been interrupted, the CPU 72 determines whether a diagnosis executability flag F is 1 (step S130). The diagnosis executability flag F is a flag indicating whether a single-electrode welding diagnosis can be made or not (a single-electrode welding diagnosis is executable or not). The value 1 indicates that a single-electrode welding diagnosis can be made (executable), and the value 0 indicates that a single-electrode welding diagnosis cannot be made (non-executable).

Figure 3:
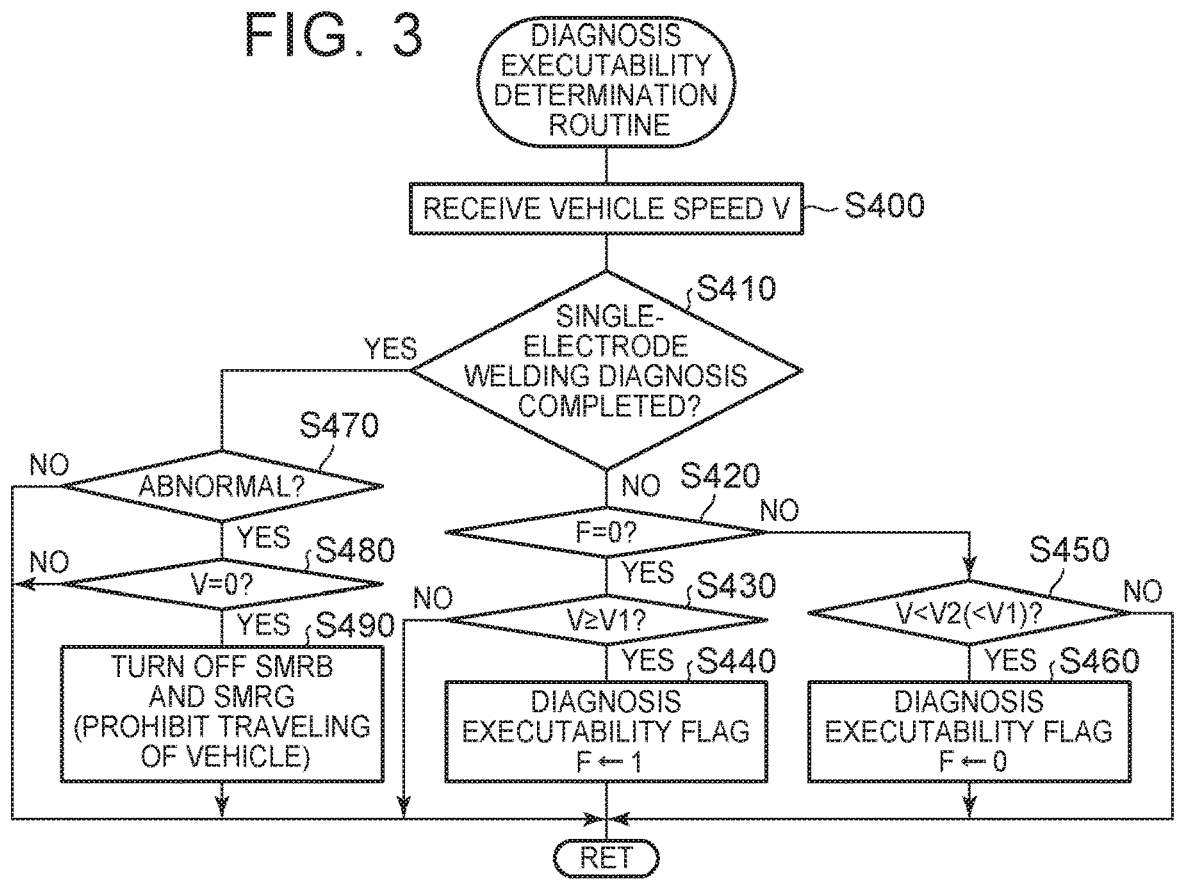
FIG. 3 is a flowchart illustrating an example of a diagnosis executability determination routine that is executed by the CPU of the electronic control unit.

The CPU 72 of the electronic control unit 70 sets the diagnosis executability flag F by executing a diagnosis executability determination routine shown in FIG. 3. The diagnosis executability determination routine will now be described, and further description of the routine for making a single-electrode welding diagnosis during traveling of the vehicle will be given later. In the diagnosis executability determination routine, the CPU 72 of the electronic control unit 70 first receives a vehicle speed V from the vehicle speed sensor 88 (step S400). The CPU 72 then determines whether a single-electrode welding diagnosis has been completed (step S410). When it is determined that a single-electrode welding diagnosis has not been completed, the CPU 72 determines whether the current diagnosis executability flag F is 0 (non-executable) (step S420). When it is determined that the current diagnosis executability flag F is 0, the CPU 72 then determines whether the received vehicle speed V is equal to or higher than a first vehicle speed V1 (e.g., 10 km/h or 15 km/h) (step S430). When it is determined that the vehicle speed V is less than the first vehicle speed V1, the CPU 72 terminates the routine without changing the value of the diagnosis executability flag F. When it is determined that the vehicle speed V is equal to or higher than the first vehicle speed V1, the CPU 72 sets the diagnosis executability flag F to 1 (executable) (step S440) and terminates the routine. When it is determined in S420 that the current diagnosis executability flag F is 1, the CPU 72 determines whether the received vehicle speed V is less than a second vehicle speed V2 (e.g., 3 km/h or 5 km/h) (step S450). When it is determined that the vehicle speed V is equal to or higher than the second vehicle speed V2, the CPU 72 terminates the routine without changing the value of the diagnosis executability flag F. When it is determined that the vehicle speed V is less than the second vehicle speed V2, the CPU 72 sets the diagnosis executability flag F to 0 (non-executable) (step S460) and terminates the routine. In the present embodiment, the second vehicle speed V2 is set to a value lower than the first vehicle speed V1 so that the state does not frequently switch between the executable state and the non-executable state. When it is determined in step S410 that a single-electrode welding diagnosis has been completed, the CPU 72 determines whether the obtained diagnosis result is abnormal (step S470). When it is determined that the diagnosis result is not abnormal but normal, the CPU 72 terminates the routine. When it is determined that the diagnosis result is abnormal, the CPU 72 determines whether the vehicle speed V is 0 (the electric car 20 has been stopped) or not (step S480). When it is determined that the vehicle speed V is not 0, the CPU 72 terminates the routine. When it is determined that the vehicle speed V is 0, the CPU 72 displays a predetermined warning, turns off the system main relay 38 (the positive-side relay SMRB, the negative-side relay SMRG) to prohibit further traveling of the electric car 20 (step S490), and terminates the routine. That is, when the result of a single-electrode welding diagnosis made during traveling of the electric car 20 is abnormal, the CPU 72 waits until the electric car 20 is stopped and prohibits further traveling of the electric car 20 in order to ensure safety.

Returning back to the routine for making a single-electrode welding diagnosis during traveling of the vehicle, when it is determined in step S130 that the diagnosis executability flag F is 1 (executable), the CPU 72 turns off the positive-side relay DCRB of the charging relay 52 and turns on the negative-side relay DCRG thereof (step S140) to start a single-electrode welding diagnosis of the positive-side relay DCRB (step S150) and terminates the routine. The single-electrode welding diagnosis is described above.

If the single-electrode welding diagnosis of the positive-side relay DCRB is started, the CPU 72 determines in step S110 in its subsequent execution of the routine that a single-electrode welding diagnosis of the positive-side relay DCRB is being made. The CPU 72 therefore determines whether the diagnosis executability flag F is 0 (non-executable) (step S160). That is, the CPU 72 determines whether the state has changed from the executable state to the non-executable state during the single-electrode welding diagnosis. When it is determined that the diagnosis executability flag F is 1 (executable) rather than 0, the CPU 72 determines whether the determination time for a single-electrode welding diagnosis has passed (step S170). As described above, the determination time is a time that is set in order to confirm the determination result. When it is determined that the determination time has not passed, the CPU 72 terminates the routine while continuing the single-electrode welding diagnosis. When it is determined that the determination time has passed, the CPU 72 terminates the single-electrode welding diagnosis of the positive-side relay DCRB, turns off both the positive-side relay DCRB and the negative-side relay DCRG (step S180), and terminates the routine.

If it is determined in step S160 during the single-electrode welding diagnosis of the positive-side relay DCRB that the diagnosis executability flag F is 0 (non-executable), the CPU 72 turns off both the positive-side relay DCRB and the negative-side relay DCRG (step S190), interrupts the single-electrode welding diagnosis (step S200), and terminates the routine. It is when the vehicle speed V being equal to or higher than the first vehicle speed V1 is reduced to a value less than the second vehicle speed V2 before completion of a single-electrode welding diagnosis that the diagnosis executability flag F is set to 0 (non-executable) during the single-electrode welding diagnosis after the single-electrode welding diagnosis is started with the diagnosis executability flag F being 1 (executable). In this case, continuing the single-electrode welding diagnosis presents a risk that a high voltage may be applied to the electrode parts of the vehicle-side inlet 54 in a situation where the user etc. is able to touch the vehicle-side inlet 54. The single-electrode welding diagnosis is therefore interrupted. When the single-electrode welding diagnosis is interrupted, the CPU 72 determines in step S120 in its subsequent execution of the routine that the single-electrode welding diagnosis of the positive-side relay DCRB has been interrupted. The CPU 72 then determines whether the diagnosis executability flag F is 1 (executable) (step S210). When it is determined that the diagnosis executability flag F is 0 (non-executable), the CPU 72 terminates the routine. When it is determined that the diagnosis executability flag F is 1, the CPU 72 turns off the positive-side relay DCRB and turns on the negative-side relay DCRG (step S220), resumes the single-electrode welding diagnosis of the positive-side relay DCRB (step S230), and terminates the routine. That is, when the single-electrode welding diagnosis has been interrupted, the CPU 72 waits until the state switches from the non-executable state to the executable state (the vehicle speed V is equal to or higher than the first vehicle speed V1). The CPU 72 resumes the single-electrode welding diagnosis when the state switches to the executable state. When it is determined in step S110 that the single-electrode welding diagnosis is being made, it is determined in step S160 that the diagnosis executability flag F is 1, and it is determined in step S170 that the determination time has passed, the CPU 72 terminates the single-electrode welding diagnosis of the positive-side relay DCRB, turns off the positive-side relay DCRB and the negative-side relay DCRG (step S180), and terminates the routine.

If the single-electrode welding diagnosis of the positive-side relay DCRB is terminated, the CPU 72 determines in step S100 in its subsequent execution of the routine that the single-electrode welding diagnosis of the positive-side relay DCRB has been completed. The routine therefore proceeds to step S240, and the CPU 72 makes a single-electrode welding diagnosis of the negative-side relay DCRG.

In the single-electrode welding diagnosis of the negative-side relay DCRG, the CPU 72 first determines whether a single-electrode welding diagnosis of the negative-side relay DCRG has been completed (step S240), is being made (step S250), and has been interrupted (step S260). When it is determined that a single-electrode welding diagnosis of the negative-side relay DCRB has not been completed, is not being made, and has not been interrupted, the CPU 72 determines whether the diagnosis executability flag F is 1 (step S270). When it is determined that the diagnosis executability flag F is 1 (executable), the CPU 72 turns on the positive-side relay DCRB of the charging relay 52 and turns off the negative-side relay DCRG thereof (step S280), starts a single-electrode welding diagnosis of the negative-side relay DCRB (step S290), and terminates the routine.

If the single-electrode welding diagnosis of the negative-side relay DCRG is started, the CPU 72 determines in step S250 in its subsequent execution of the routine that a single-electrode welding diagnosis of the negative-side relay DCRG is being made. The CPU 72 therefore determines whether the diagnosis executability flag F is 0 (non-executable) (step S300). When it is determined that the diagnosis executability flag F is 1 (executable) rather than 0, the CPU 72 determines whether the determination time for a single-electrode welding diagnosis has passed (step S310). When it is determined that the determination time has not passed, the CPU 72 terminates the routine while continuing the single-electrode welding diagnosis. When it is determined that the determination time has passed, the CPU 72 terminates the single-electrode welding diagnosis of the negative-side relay DCRG, turns off both the positive-side relay DCRB and the negative-side relay DCRG (step S320), and terminates the routine.

If it is determined in step S300 during the single-electrode welding diagnosis of the negative-side relay DCRG that the diagnosis executability flag F is 0 (non-executable), the CPU 72 turns off both the positive-side relay DCRB and the negative-side relay DCRG (step S330), interrupts the single-electrode welding diagnosis (step S340), and terminates the routine. When the single-electrode welding diagnosis is interrupted, the CPU 72 determines in step S260 in its subsequent execution of the routine that the single-electrode welding diagnosis of the negative-side relay DCRG has been interrupted. The CPU 72 then determines whether the diagnosis executability flag F is 1 (executable) (step S350). When it is determined that the diagnosis executability flag F is 0 (non-executable), the CPU 72 terminates the routine. When it is determined that the diagnosis executability flag F is 1, the CPU 72 turns on the positive-side relay DCRB and turns off the negative-side relay DCRG (step S360), resumes the single-electrode welding diagnosis of the negative-side relay DCRG (step S370), and terminates the routine. That is, when the single-electrode welding diagnosis has been interrupted, the CPU 72 waits until the state switches from the non-executable state to the executable state (the vehicle speed V is equal to or higher than the first vehicle speed V1). The CPU 72 resumes the single-electrode welding diagnosis when the state switches to the executable state. In this case, since the single-electrode welding diagnosis of the positive-side relay DCRB has been completed, the CPU 72 resumes the single-electrode welding diagnosis to diagnose the negative-side relay DCRG. When it is determined in step S250 that the single-electrode welding diagnosis is being made, it is determined in step S300 that the diagnosis executability flag F is 1, and it is determined in step S310 that the determination time has passed, the CPU 72 terminates the single-electrode welding diagnosis of the negative-side relay DCRG, turns off the positive-side relay DCRB and the negative-side relay DCRG (step S320), and terminates the routine.

Figure 4:
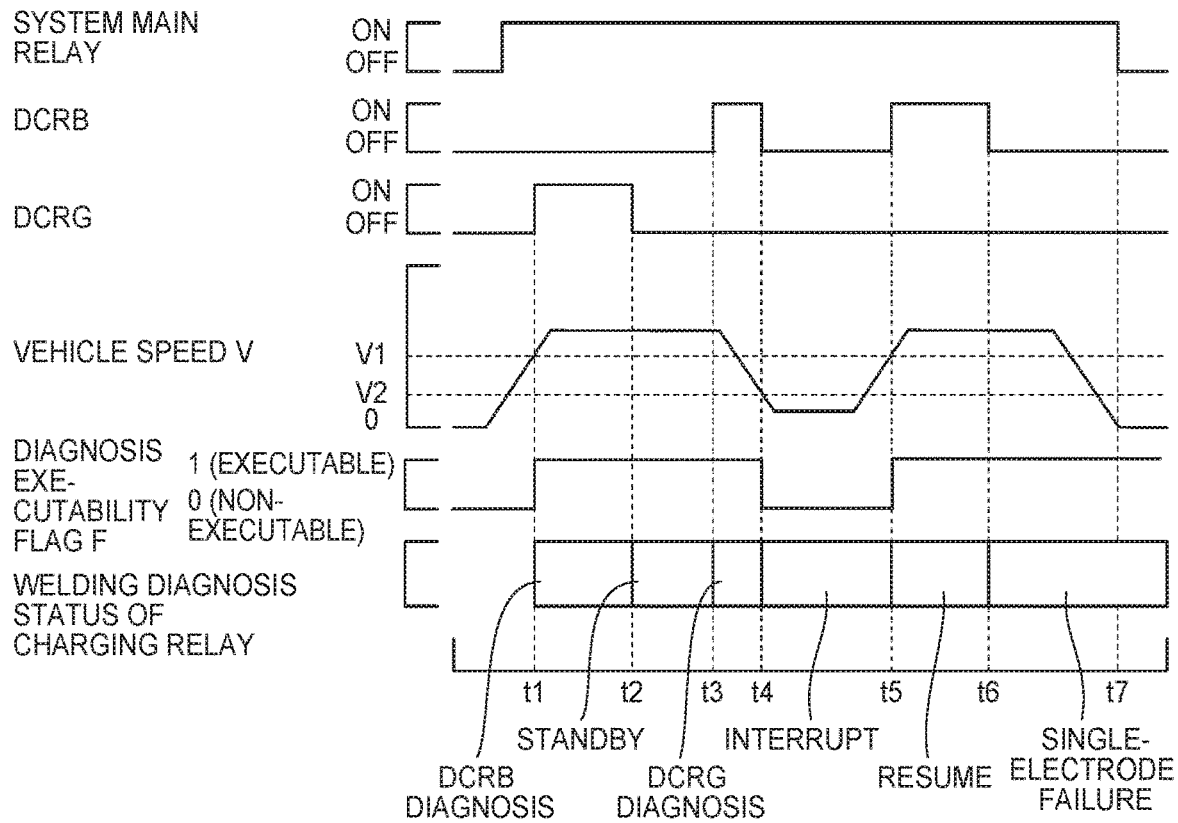
FIG. 4 is a timing chart illustrating how a system main relay, a charging relay (a positive-side relay DCRB, a negative-side relay DCRG), a vehicle speed V, and a diagnosis executability flag F change with time when a single-electrode welding diagnosis of the charging relay is made during traveling of the electric car.

FIG. 4 is a timing chart illustrating how the system main relay 38, the charging relay 52 (the positive-side relay DCRB, the negative-side relay DCRG), the vehicle speed V, and the diagnosis executability flag F change with time when a single-electrode welding diagnosis of the charging relay 52 is made during traveling of the electric car 20. The single-electrode welding diagnosis during traveling of the electric car 20 is made when the external connector 154 is not connected to the vehicle-side inlet 54 and a single-electrode welding diagnosis has not been completed. As shown in the figure, when the vehicle speed V becomes equal to or higher than the first vehicle speed V1, the CPU 72 sets the diagnosis executability flag F to 1 (executable) and starts the diagnosis of the positive-side relay DCRB (time t1). In the present embodiment, the diagnosis is made in order of the positive-side relay DCRB and the negative-side relay DCRG. However, the diagnosis may be made in order of the negative-side relay DCRG and the positive-side relay DCRB. After the CPU 72 terminates the diagnosis of the positive-side relay DCRB (time t2), it starts the diagnosis of the negative-side relay DCRG after a predetermined standby time (time t3). When the vehicle speed V becomes less than the second vehicle speed V2 that is lower than the first vehicle speed V1, the CPU 72 sets the diagnosis executability flag F to 0 (non-executable) and interrupts the diagnosis (time t4). When the vehicle speed V becomes equal to or higher than the first vehicle speed V1 during interruption of the diagnosis, the CPU 72 sets the diagnosis executability flag F to 1 (indicating that a single-electrode welding diagnosis can be made) and resumes the diagnosis (time t5). When the diagnosis result is abnormal at the time the diagnosis is terminated (time t6), the CPU 72 waits until the vehicle speed V becomes equal to 0 and then turns off the system main relay 38 to prohibit further traveling of the electric car 20 (time t7).

In the electric car 20 of the above embodiment, in the case where the electronic control unit 70 makes a welding diagnosis of the charging relay 52 with the external connector 154 not being connected to the vehicle-side inlet 54, the electronic control unit 70 starts the welding diagnosis when the vehicle speed V becomes equal to or higher than the first vehicle speed V1. The electronic control unit 70 interrupts the diagnosis when the vehicle speed V becomes equal to or lower than the second vehicle speed V2 during diagnosis. The electronic control unit 70 resumes the diagnosis when the vehicle speed V becomes equal to or higher than the first vehicle speed V1 during interruption of the diagnosis. This ensures high safety even if the electric car 20 is decelerated and stopped before the diagnosis result is confirmed after the welding diagnosis of the charging relay 52 is started and thus the user etc. is able to touch the vehicle-side inlet 54. Moreover, since the diagnosis is interrupted when the vehicle speed V becomes equal to or lower than the second vehicle speed V2 during diagnosis, the first vehicle speed V1 can be set to a lower value such as, e.g., 10 km/h or 15 km/h. The number of opportunities to make a welding diagnosis can thus be increased and the diagnosis can be quickly made. This further enhances safety at the time the welding diagnosis of the charging relay 52 is made with the external power supply device not being connected to the vehicle-side inlet 54, and also allows the welding diagnosis to be made more quickly.

In the electric car 20 of the embodiment, the second vehicle speed V2 is set to a value lower than the first vehicle speed V1. This restrains frequent switching between the executable state and the non-executable state and thus restrains the welding diagnosis from being repeatedly interrupted and resumed.

In the electric car 20 of the embodiment, when the result of the welding diagnosis made during traveling of the electric car 20 is abnormal, the CPU 72 waits until the electric car 20 is stopped and then turns off the system main relay 38 to prohibit further traveling of the electric car 20. This ensures higher safety.

In the electric car 20 of the embodiment, a two-electrode welding diagnosis and a single-electrode welding diagnosis are sequentially made with the external connector 154 being connected to the vehicle-side inlet 54. When a single-electrode welding diagnosis has not been completed at the timing of detaching the external connector 154 from the vehicle-side inlet 54, the single-electrode welding diagnosis is made with the external connector 154 not being connected to the vehicle-side inlet 54. However, only the two-electrode welding diagnosis may be made with the external connector 154 being connected to the vehicle-side inlet 54, and the single-electrode welding diagnosis may be made with the external connector 154 not being connected to the vehicle-side inlet 54.

In the electric car 20 of the embodiment, the second vehicle speed V2 is set to a value lower than the first vehicle speed V1. However, the second vehicle speed V2 may be set to the same value as the first vehicle speed V1.

In the electric car 20 of the embodiment, when the result of the welding diagnosis made during traveling of the electric car 20 is abnormal, the CPU 72 waits until the electric car 20 is stopped and then turns off the system main relay 38 to prohibit further traveling of the electric car 20. However, even if the result of the welding diagnosis made during traveling of the electric car 20 is abnormal, the CPU 72 may display a predetermined warning and allow the electric car 20 to travel.

In the electric car 20 of the embodiment, the battery 36 is used as an electrical storage device. However, the electrical storage device may be any device capable of storing electricity therein, such as a capacitor.

In the embodiment, the disclosure is carried out in the form of the electric car 20 having the motor 32. However, the disclosure may be carried out in the form of a hybrid car having an engine in addition to the motor 32.

The correspondence between the main elements of the embodiment and the main elements of the disclosure described in "SUMMARY" will be described. The battery 36, the external DC power supply device 120, the vehicle-side inlet 54, the charging power line 50, the charging relay 52, the positive-side relay DCRB, the negative-side relay DCRG, and the electronic control unit 70 in the embodiment can be regarded as the "electrical storage device," the "external power supply device," the "charging inlet," the "charging line," the "charging relay," the "positive-side relay," the "negative-side relay," and the "electronic control unit" of the disclosure. The motor 32, the low voltage-side power line 44, and the system main relay 38 in the embodiment correspond to the "motor," the "power line," and the "main relay" of the disclosure.

The correspondence between the main elements of the embodiment and the main elements of the disclosure described in "SUMMARY" is shown merely by way of example in order to specifically describe the mode in which the embodiment carries out the disclosure described in "SUMMARY." Therefore, the correspondence is not intended to limit the elements of the disclosure described in "SUMMARY." That is, the disclosure described in "SUMMARY" should be interpreted based on the description in "SUMMARY" and the embodiment is merely a specific example of the disclosure described in "SUMMARY."

Although the mode for carrying out the disclosure is described above, the disclosure is not limited in any way to such an embodiment but can be carried out in various forms without departing from the spirit and scope of the disclosure.

The disclosure is applicable to the manufacturing industry of electric vehicles, etc.

What is claimed is:

1. An electric vehicle, comprising:
   an electrical storage device;
   a charging inlet that is connected to an external power supply device;
   a charging relay including a positive-side relay and a negative-side relay, the positive-side relay being provided on a positive side of a charging line that connects the charging inlet and the electrical storage device, and the negative-side relay being provided on a negative side of the charging line; and
   an electronic control unit configured to make a welding diagnosis for determining whether welding of the charging relay has occurred,
   in a case of making the welding diagnosis of the charging relay with the external power supply device not being connected to the charging inlet, the electronic control unit being configured to start the welding diagnosis when a vehicle speed becomes equal to or higher than a first vehicle speed, interrupt the welding diagnosis when the vehicle speed becomes equal to or lower than a second vehicle speed during the welding diagnosis, and resume the welding diagnosis when the vehicle speed becomes equal to or higher than the first vehicle speed during the interruption of the welding diagnosis, the second vehicle speed being equal to or lower than the first vehicle speed.

2. The electric vehicle according to claim 1, wherein the second vehicle speed is lower than the first vehicle speed.

3. The electric vehicle according to claim 1, wherein
   the electronic control unit is configured to make a single-electrode welding diagnosis as the welding diagnosis that is made with the external power supply device not being connected to the charging inlet,
   the single-electrode welding diagnosis is a diagnosis for determining whether welding of only one of the positive-side relay and the negative-side relay has occurred, and
   in the case where the single-electrode welding diagnosis is interrupted with the welding diagnosis of one of the positive-side relay and the negative-side relay being completed and the welding diagnosis of the other relay not being completed, the electronic control unit is configured to make only the welding diagnosis of the other relay when resuming the single-electrode welding diagnosis.

4. The electric vehicle according to claim 1, wherein
   the electronic control unit is configured to sequentially make a two-electrode welding diagnosis and a single-electrode welding diagnosis with the external power supply device being connected to the charging inlet,
   the two-electrode welding diagnosis is a diagnosis for determining whether welding of both the positive-side relay and the negative-side relay has occurred,
   the single-electrode welding diagnosis is a diagnosis for determining whether welding of only one of the positive-side relay and the negative-side relay has occurred, and
   the electronic control unit is configured to make the single-electrode welding diagnosis with the external power supply device not being connected to the charging inlet, when a result of the two-electrode welding diagnosis is normal but the external power supply device is detached from the charging inlet before the single-electrode welding diagnosis is completed.

5. The electric vehicle according to claim 1, further comprising:
   a motor that outputs power for driving the electric vehicle; and
   a main relay provided on a power line that supplies electric power from the electrical storage device to the motor, wherein
   the charging line is connected to the power line at a position between the main relay and the motor, and
   in the case where a result of the welding diagnosis made while the electric vehicle is traveling with the main relay on is abnormal, the electronic control unit is configured to turn off the main relay when the electric vehicle is stopped and prohibit further traveling of the electric vehicle.

6. A control method for an electric vehicle, the electric vehicle including an electrical storage device, a charging inlet that is connected to an external power supply device, a charging relay, and an electronic control unit, the charging relay including a positive-side relay and a negative-side relay, the positive-side relay being provided on a positive side of a charging line that connects the charging inlet and the electrical storage device, and the negative-side relay being provided on a negative side of the charging line, the control method comprising:

making, by the electronic control unit, a welding diagnosis for determining whether welding of the charging relay has occurred; and when the electronic control unit makes the welding diagnosis of the charging relay with the external power supply device not being connected to the charging inlet, starting the welding diagnosis, by the electronic control unit, when a vehicle speed becomes equal to or higher than a first vehicle speed, interrupting the welding diagnosis by the electronic control unit when the vehicle speed becomes equal to or lower than a second vehicle speed during the welding diagnosis, and resuming the welding diagnosis by the electronic control unit when the vehicle speed becomes equal to or higher than the first vehicle speed during the interruption of the welding diagnosis, the second vehicle speed being equal to or lower than the first vehicle speed.

* * * * *